(12) United States Patent
Farnworth et al.

(10) Patent No.: US 7,256,490 B2
(45) Date of Patent: *Aug. 14, 2007

(54) TEST CARRIER FOR SEMICONDUCTOR COMPONENTS HAVING CONDUCTORS DEFINED BY GROOVES

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/591,744

(22) Filed: Nov. 2, 2006

(65) Prior Publication Data

US 2007/0045808 A1 Mar. 1, 2007

Related U.S. Application Data

(60) Continuation of application No. 11/216,959, filed on Aug. 31, 2005, now Pat. No. 7,132,366, which is a continuation of application No. 09/420,086, filed on Oct. 18, 1999, now Pat. No. 6,979,898, which is a division of application No. 09/110,232, filed on Jul. 6, 1998, now Pat. No. 6,107,119.

(51) Int. Cl.
*H01L 23/04* (2006.01)
*H01L 23/52* (2006.01)
*H01L 23/48* (2006.01)
*H01L 29/40* (2006.01)

(52) U.S. Cl. .................... 257/698; 257/E23.06
(58) Field of Classification Search ............ None
See application file for complete search history.

(56) References Cited

U.S. PATENT DOCUMENTS

| | | | |
|---|---|---|---|
| 4,527,041 A | 7/1985 | Kai | |
| 4,739,448 A | 4/1988 | Rowe et al. | |
| 5,065,227 A | 11/1991 | Frankeny et al. | |
| 5,338,645 A | 8/1994 | Henderson et al. | |
| 5,391,917 A | 2/1995 | Gilmour et al. | |
| 5,426,072 A | 6/1995 | Finnila | |
| 5,451,165 A | 9/1995 | Cearley-Cabbiness et al. | |
| 5,495,179 A | 2/1996 | Wood et al. | |
| 5,519,332 A | 5/1996 | Wood et al. | |
| 5,528,080 A | 6/1996 | Goldstein | |

(Continued)

OTHER PUBLICATIONS

Anthony, T. R. "Forming electrical interconnections through semiconductor wafers", J. Appl. Phys., Aug. 1981, pp. 5340-5349.

*Primary Examiner*—David A. Zarneke
(74) *Attorney, Agent, or Firm*—Stephen A. Gratton

(57) ABSTRACT

A test carrier for a semiconductor component includes a base for retaining the component, and an interconnect on the base having contacts configured to electrically engage component contacts on the component. The base includes conductors in electrical communication with the contacts on the interconnect, which are defined by grooves in a conductive layer. In addition, the conductors include first portions of the conductive layer configured for electrical transmission, which are separated from one another by second portions of the conductive layer configured for no electrical transmission. The test carrier is configured for mounting to a burn in board in electrical communication with a test circuitry configured to apply test signals through the contacts on the interconnect to the component.

25 Claims, 6 Drawing Sheets

U.S. PATENT DOCUMENTS

| | | |
|---|---|---|
| 5,531,022 A | 7/1996 | Beaman et al. |
| 5,541,525 A | 7/1996 | Wood et al. |
| 5,578,934 A | 11/1996 | Wood et al. |
| 5,634,267 A | 6/1997 | Farnworth et al. |
| 5,639,695 A | 6/1997 | Jones et al. |
| 5,663,593 A | 9/1997 | Mostafazadeh et al. |
| 5,666,722 A | 9/1997 | Tamm et al. |
| 5,686,317 A | 11/1997 | Akram et al. |
| 5,691,568 A | 11/1997 | Chou et al. |
| 5,691,649 A | 11/1997 | Farnworth et al. |
| 5,693,568 A | 12/1997 | Liu et al. |
| 5,717,245 A | 2/1998 | Peter |
| 5,724,727 A | 3/1998 | Chopra et al. |
| 5,726,493 A | 3/1998 | Yamashita et al. |
| 5,741,726 A | 4/1998 | Barber |
| 5,750,417 A | 5/1998 | Nellissen |
| 5,783,461 A | 7/1998 | Hembree |
| 5,815,000 A | 9/1998 | Farnworth et al. |
| 5,825,195 A | 10/1998 | Hembree et al. |
| 5,844,418 A | 12/1998 | Wood et al. |
| 5,854,534 A | 12/1998 | Beilin et al. |
| 5,878,485 A | 3/1999 | Wood et al. |
| 5,896,036 A | 4/1999 | Wood et al. |
| 5,929,647 A | 7/1999 | Akram et al. |
| 5,931,685 A | 8/1999 | Hembree et al. |
| 6,013,948 A | 1/2000 | Akram et al. |
| 6,025,728 A | 2/2000 | Hembree et al. |
| 6,060,893 A | 5/2000 | Farnworth et al. |
| 6,060,894 A | 5/2000 | Hembree et al. |
| 6,072,323 A | 6/2000 | Hembree et al. |
| 6,091,251 A | 7/2000 | Wood et al. |
| 6,094,058 A | 7/2000 | Hembree et al. |
| 6,107,109 A | 8/2000 | Akram et al. |
| 6,107,119 A | 8/2000 | Farnworth et al. |
| 6,114,240 A | 9/2000 | Akram et al. |
| 6,181,011 B1 | 1/2001 | Rostoker et al. |
| 6,188,232 B1 | 2/2001 | Akram et al. |
| 6,208,157 B1 | 3/2001 | Akram et al. |
| 6,215,322 B1 | 4/2001 | Farnworth et al. |
| 6,222,379 B1 | 4/2001 | Farnworth et al. |
| 6,255,833 B1 | 7/2001 | Akram et al. |
| 6,258,609 B1 | 7/2001 | Farnworth et al. |
| 6,278,286 B1 | 8/2001 | Farnworth et al. |
| 6,294,837 B1 | 9/2001 | Akram et al. |
| 6,313,651 B1 | 11/2001 | Hembree et al. |
| 6,340,894 B1 | 1/2002 | Farnworth et al. |
| 6,369,600 B2 | 4/2002 | Farnworth et al. |
| 6,383,825 B1 | 5/2002 | Farnworth et al. |
| 6,384,701 B1 | 5/2002 | Yamada et al. |
| 6,392,429 B1 | 5/2002 | Hembree et al. |
| 6,979,898 B1 * | 12/2005 | Farnworth et al. .......... 257/698 |
| 7,132,366 B2 | 11/2006 | Farnworth et al. |

* cited by examiner

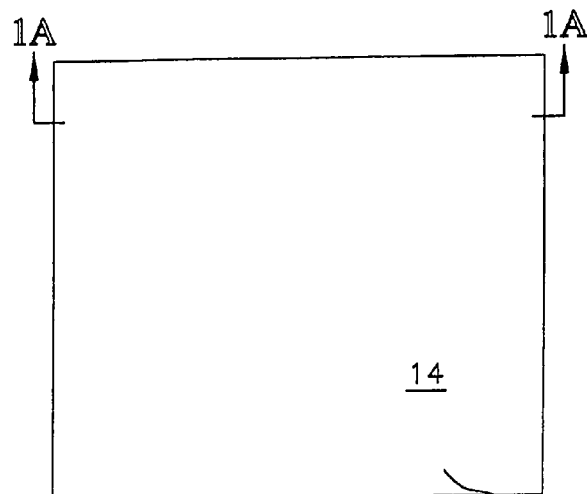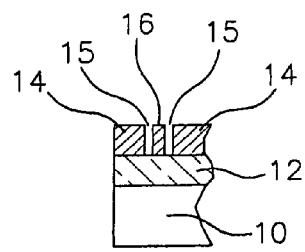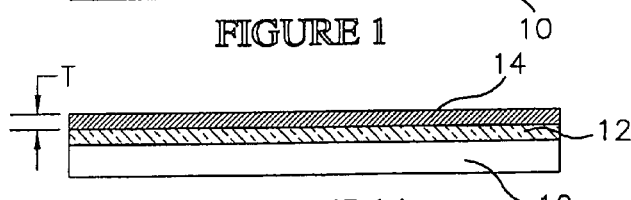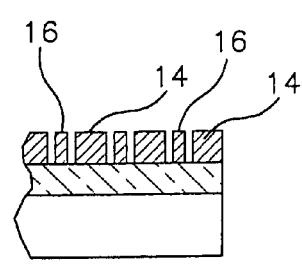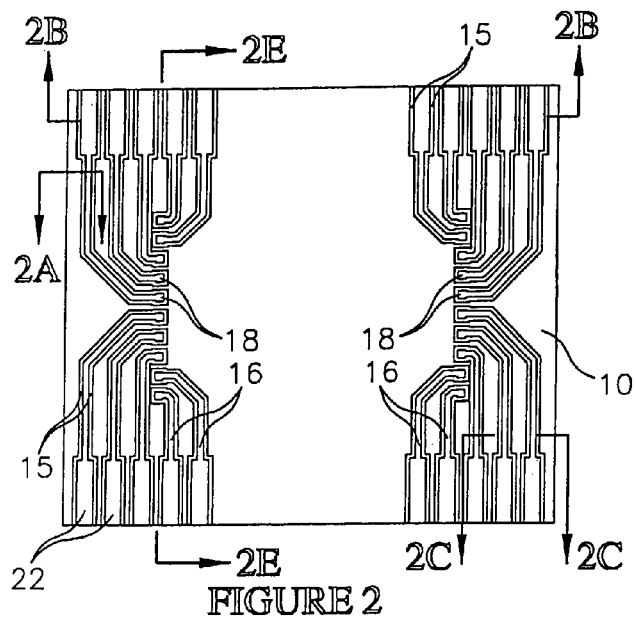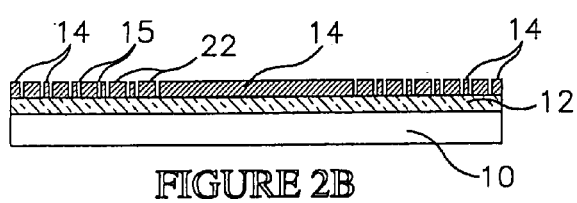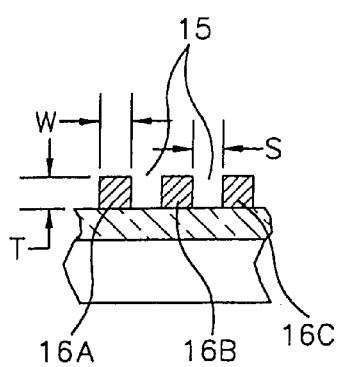

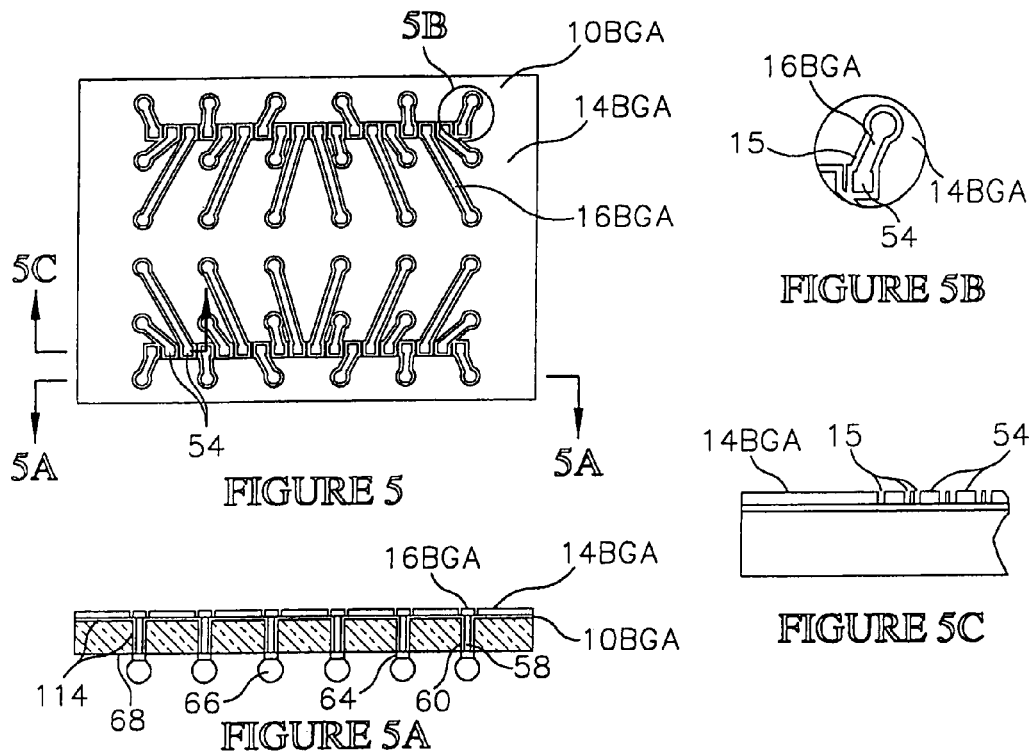
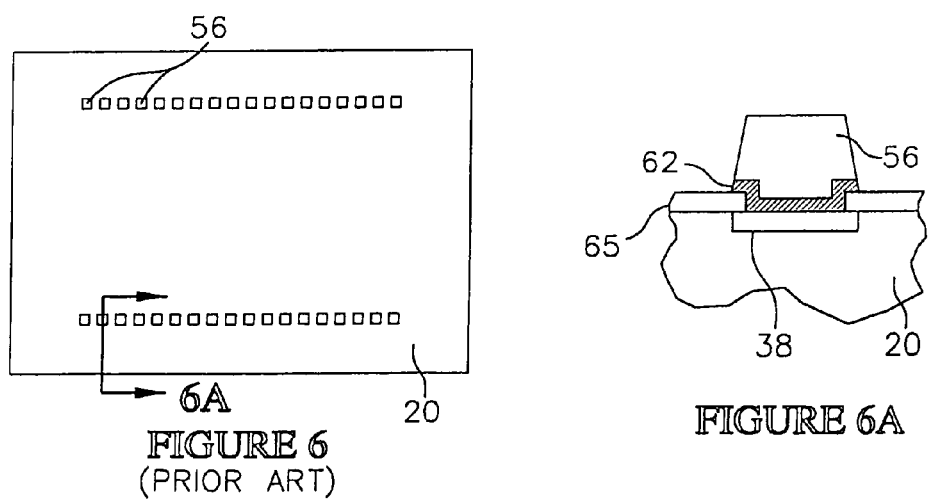
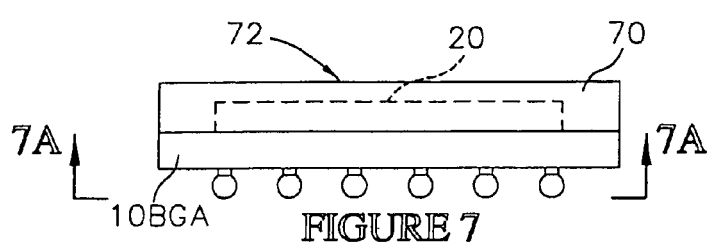

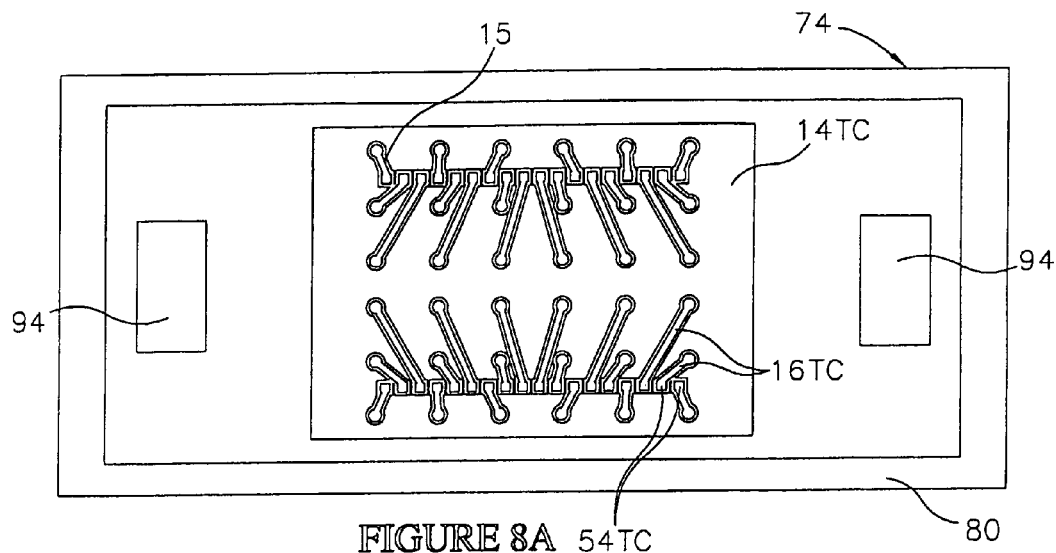
FIGURE 8A
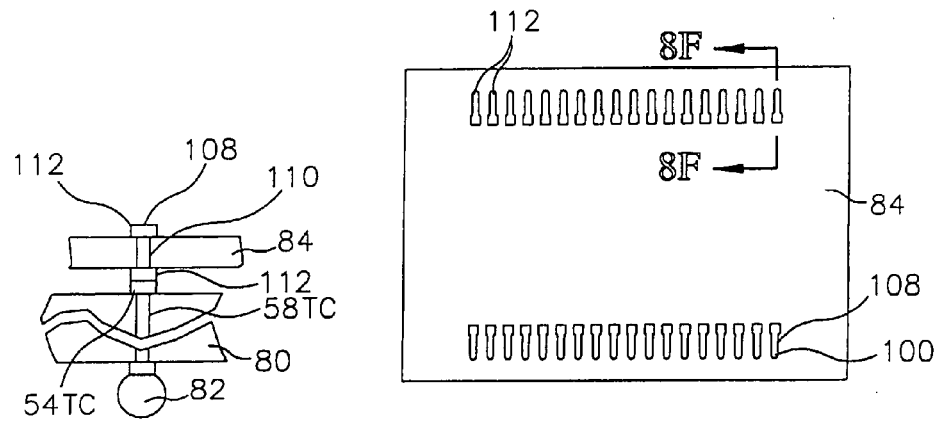
FIGURE 8B
FIGURE 8C
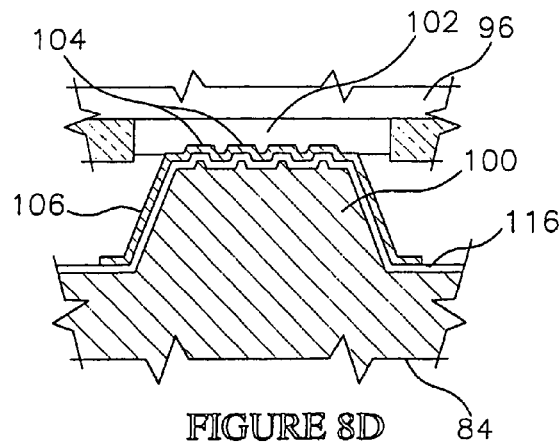
FIGURE 8D

TEST CARRIER FOR SEMICONDUCTOR COMPONENTS HAVING CONDUCTORS DEFINED BY GROOVES

CROSS REFERENCE TO RELATED APPLICATIONS

This application is a continuation of Ser. No. 11,216,959, filed Aug. 31, 2005, Pat. No. 7,132,366, which is a continuation of Ser. No. 09/420,086, filed on Oct. 18, 1999, Pat. No. 6,979,898, which is a division of Ser. No. 09/110,232, filed on Jul. 06, 1998, Pat. No. 6,107,119.

FIELD OF THE INVENTION

This invention relates generally semiconductor manufacture and particularly to an improved method for fabricating semiconductor components, and to improved semiconductor components and electronic assemblies fabricated using the method.

BACKGROUND OF THE INVENTION

Semiconductor components, such as chip scale packages (CSP), ball grid array (BGA) substrates, interconnects, test carriers, multi chip modules (MCM) and printed circuit boards (PCB), often include patterns of conductors. Typically, the conductors are formed using a conventional metallization process, such as blanket depositing, photopatterning and then etching a metal layer. In addition, conductive vias can be formed to electrically connect the conductors to contacts, or to other patterns of conductors, located on different surfaces of the component. Typically, the conductive vias can be formed by etching or punching holes, and then filling the holes with a conductive metal, using an electroless or electrolytic deposition process.

As semiconductor components become smaller and more complex, conventional processes sometimes cannot be employed to form the conductors and conductive vias. In particular the required size, spacing and shape of the conductors and vias cannot always be achieved using conventional processes. In addition, conventional processes, such as wet etching, are performed using environmentally hazardous materials and produce toxic waste.

Accordingly, there is a need in the art for improved processes for fabricating semiconductor components with smaller and denser patterns of conductors and conductive vias. In addition, improved processes that can be performed without the use of environmentally hazardous materials are needed.

SUMMARY OF THE INVENTION

In accordance with the present invention, an improved method for fabricating semiconductor components is provided. Also provided are improved components and electronic assemblies fabricated using the method.

Initially, a substrate with a blanket deposited conductive layer is provided. Depending on the application the substrate can comprise plastic, glass filled resin, silicon, or ceramic. Preferably, the conductive layer comprises a highly conductive metal, such as foil adhesively bonded to the substrate, or a thin film formed using a deposition process such as CVD.

Using a laser machining process, a pattern of conductors is formed on the substrate by ablating portions of the conductive layer to form grooves. Each conductor is defined by a groove on each side. The conductors can be made extremely small, closely spaced, and with precise dimensional tolerances due to the accuracy of the laser machining process. In addition, some of the conductors can be configured as signal traces, and others as co-planar ground, or voltage traces, for adjusting impedance values of the signal traces.

A laser system for performing the method includes a laser, a computer controller for controlling the laser, and an X-Y table for moving the substrate to produce the required pattern of grooves.

The method can also include laser machining, etching, or punching holes in the substrate, and then depositing a conductive material in the holes to form conductive vias. The conductive vias can be used to electrically connect the conductors to external contacts on the substrate. The conductive material for the conductive vias can comprise an electroless or electrolytically deposited metal, or a conductive polymer.

A variety of semiconductor components can be fabricated using the method of the invention. In a first embodiment a substrate with laser machined conductors is formed, and used to form printed circuit boards, and multi chip modules. In this embodiment one or more semiconductor dice can be wire bonded, or flip chip mounted, to the laser machined conductors on the substrate.

In an alternate embodiment, a BGA substrate having laser machined conductors can be used to form a chip scale package. The BGA substrate includes conductive vias in electrical communication with the laser machined conductors, and an array of ball contacts formed on the substrate in electrical communication with the conductive vias. The chip scale package includes the BGA substrate, a semiconductor die bonded to the conductors on the BGA substrate, and an encapsulant covering the die.

In another alternate embodiment, laser machined conductors are formed on a base of a test carrier configured to package semiconductor components, such as bare dice, and chip scale packages, for testing. The test carrier includes the base, an interconnect for electrically contacting a component under test, and a force applying mechanism for biasing the component under test against the interconnect. The interconnect is configured for bonding to the laser machined conductors on the base. In addition, external contacts on the base are formed in a ball grid array, and electrically connected to the pattern of conductors using conductive vias in the base.

BRIEF DESCRIPTION OF THE DRAWINGS

FIG. 1 is a plan view of a substrate prior to performing the method of the invention;

FIG. 1A is a cross sectional view taken along section line 1A-1A of FIG. 1;

FIG. 2 is a plan view of the substrate following formation of conductors in accordance with the method of the invention;

FIG. 2A is a cross sectional view taken along section line 2A-2A of FIG. 2;

FIG. 2B is a cross sectional view taken along section line 2B-2B of FIG. 2;

FIG. 2C is a cross sectional view taken along section line 2C-2C of FIG. 2;

FIG. 2D is a cross sectional view equivalent to FIG. 2C illustrating alternate embodiment impedance matched conductors;

FIG. 5 is a plan view of a BGA substrate fabricated using the method of the invention;

FIG. 5A is a cross sectional view taken along section line 5A-5A of FIG. 5;

FIG. 5B is an enlarged portion of FIG. 5 taken along section line 5B-5B;

FIG. 5C is a cross sectional view taken along section line 5C-5C of FIG. 5;

FIG. 6 is a plan view of a prior art semiconductor die;

FIG. 6A is an enlarged cross sectional view taken along section line 6A-6A of FIG. 6 illustrating a bumped bond pad on the die;

FIG. 7 is a side elevation view of a chip scale package fabricated using the BGA substrate of FIG. 5;

FIG. 8A is a cross sectional view taken along section line 8A-8A of FIG. 8 illustrating a surface of a base of the test carrier having the laser machined conductors thereon;

FIG. 8B is an enlarged cross sectional view taken along section line 8B-8B of FIG. 8 illustrating an interconnect of the test carrier bonded to the laser machined conductors on the base;

FIG. 8C is a cross sectional view taken along section line 8C-8C of FIG. 8 illustrating a surface of the interconnect;

FIG. 8D is an enlarged cross sectional view taken along section line 8D-8D of FIG. 8 illustrating a contact on the interconnect electrically engaging a contact on the component;

DETAILED DESCRIPTION OF THE PREFERRED EMBODIMENTS

Figure 2E:
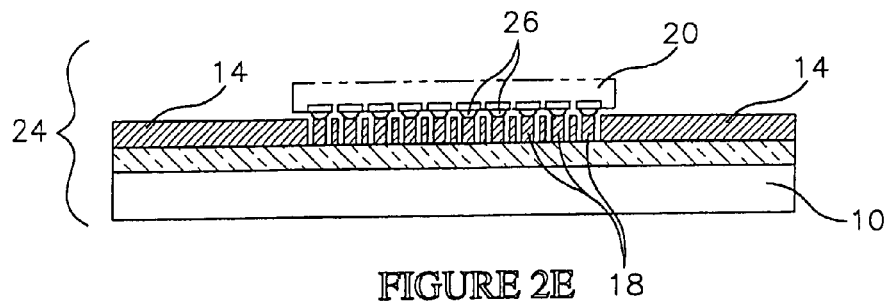
FIG. 2E is a cross sectional view taken along section line 2E-2E of FIG. 2 and also illustrating a semiconductor die in phantom forming a chip module.

FIGS. 1 and 2 illustrate steps in the method of the invention. Initially, as shown in FIGS. 1 and 1A, a substrate 10 comprising an insulating layer 12, and a blanket deposited conductive layer 14 can be provided.

Suitable materials for the substrate 10 include glass filled resins, such as FR-4, and plastics, such as polyetherimide (PEI) and polyphenyl sulfide (PPS). Another suitable material for the substrate 10 is silicon in the form of monocrystalline silicon, silicon-on-glass, or silicon-on-sapphire. Yet another suitable material for the substrate 10 is ceramic in laminated or unitary form. Also, for some applications the substrate 10 can comprise metal, germanium, or gallium arsenide.

Suitable materials for the conductive layer 14 include copper, aluminum, titanium, nickel, iridium, gold, tungsten, silver, platinum, palladium, tantalum, molybdenum or alloys of these metals. In addition, the conductive layer 14 can comprise an adhesively bonded foil, or alternately a thin film layer formed using a deposition process, such as sputtering or CVD. Still further, the conductive layer 14 can comprise a bi-metal stack, such as an adhesion layer, and a non-oxidizing outer layer. A representative thickness T for the conductive layer 14 can be from about 1 µm to 20 µm or more.

Suitable materials for the insulating layer 12 include polymers, oxides and nitrides. For example, the insulating layer 12 can comprise a polymer, such as polyimide, silicone or epoxy, which attaches the conductive layer 14 to the substrate 10. As another example, with the substrate 10 comprising silicon, the insulating layer 12 can comprise $SiO_2$ formed using a deposition or oxidation process. For some applications, the insulating layer 12 can be omitted, and the conductive layer 14 formed directly on the substrate 10. For example, with the substrate 10 comprising glass filled resin, plastic, or ceramic, the conductive layer 14 can be formed directly on the substrate 10.

Referring to FIG. 2, after providing the substrate 10 with the conductive layer 14 thereon, a pattern of conductors 16 can be formed on the substrate 10, by vaporizing portions of the conductive layer 14 using a laser to form grooves 15. FIG. 2A illustrates a single conductor 16 which is defined by grooves 15 on either side. FIG. 2C illustrates adjacent conductors 16 separated by a portion of the conductive layer 14. As shown in FIGS. 2A and 2C, the grooves 15 extend completely through the conductive layer 14 to the insulating layer 12. If the insulating layer 12 is omitted, the grooves 15 extend through the conductive layer 14 to a surface of the substrate 10. In addition, the conductors 16 are electrically isolated from one another, and from a remainder of the conductive layer 14, by the grooves 15.

The laser machining process is a subtractive process in that the grooves 15 are formed as portions of the conductive layer 14 are vaporized by a pulse of laser energy. Preferably, the laser machining process is controlled to form the grooves 15 in the conductive layer 14 without harming the insulating layer 12, or the substrate 10.

In the embodiment illustrated in FIG. 2, the conductors 16 include bond pads 18. As shown in FIG. 2E, the bond pads 18 can be bonded to solder bumps 26 on a semiconductor die 20 to form a chip module 24. Alternately the bond pads 18 can be adapted for wire bonding to the die 20. To facilitate bonding, following the laser machining process, the bond pads 18 can be plated with a solder wettable or wire bondable metal. In addition to the bond pads 18, the conductors 16 can include contact pads 22 adapted for electrical connection to outside circuitry, such as control or test circuitry for the chip module 24. As shown in FIG. 2B, the contact pads 22 are separated by portions of the conductive layer 14.

FIG. 2D illustrates alternate embodiment conductors 16A, 16B, 16C that are configured with desired impedance values. Using the laser machining process, the conductors 16A, 16B, 16C can be formed with a relatively small width W and spacing S (where S is equal to the width of a groove 15). A representative width W and spacing S can be as small as about 5 µm. In addition to the width W and spacing S being extremely small, precise dimensional tolerances for these features can be maintained. Also, a thickness T of the conductors 16A, 16B, 16C can be precisely controlled during formation of the conductive layer 14. The size, spacing, thickness, and precise dimensional tolerances, allow conductors 16A and 16C to be configured as signal paths, and conductor 16B to configured as a path to ground or voltage. This permits an impedance of the signal conductors 16A, 16C to be matched, as required, to provide impedance matched components. In addition, the ground or voltage conductor 16B is co-planar to the signal conductors 16A, 16C, such that additional insulating layers are not required, and precise impedance values can be achieved by proper selection of the width, spacing and thickness dimensions.

Figure 3:
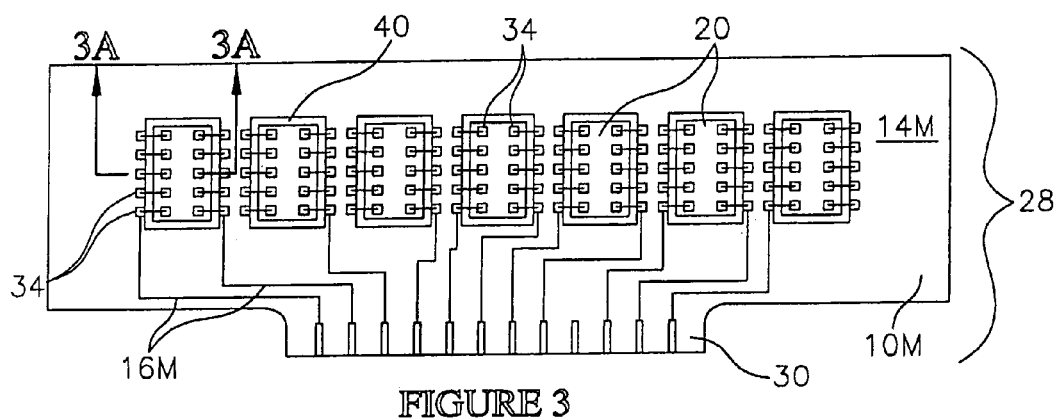
FIG. 3 is a plan view of a multi chip module fabricated using the method of the invention.
Figure 3A:
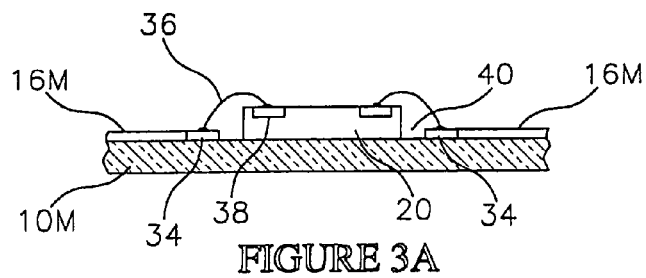
FIG. 3A is a cross sectional view taken along section line 3A-3A of FIG. 3 illustrating a die wire bonded to the multi chip module.

Referring to FIGS. 3 and 3A, an alternate embodiment semiconductor component in the form of a multi chip module 28 is shown. The multi chip module 28 includes a substrate 10M on which conductors 16M have been formed by laser machining grooves 15 in a conductive layer 14M, substantially as previously described for conductors 16 (FIG. 2). For simplicity an abbreviated pattern of conductors 16M is illustrated. In this embodiment, the conductors 16M are in electrical communication with an edge connector 30 on the substrate 10M. The edge connector 30 allows the multi chip module 28 to be electrically connected to external test or control circuitry (not shown).

The multi chip module 28 also includes openings 40 that are laser machined in the conductive layer 14M. A plurality of semiconductor dice 20 are mounted within the openings 40 and on the surface of the substrate 10M. As shown in FIG. 3A, the conductors 16M include bonding pads 34 for bonding wires 36 thereto and to bond pads 38 on the dice 20.

Figure 4:
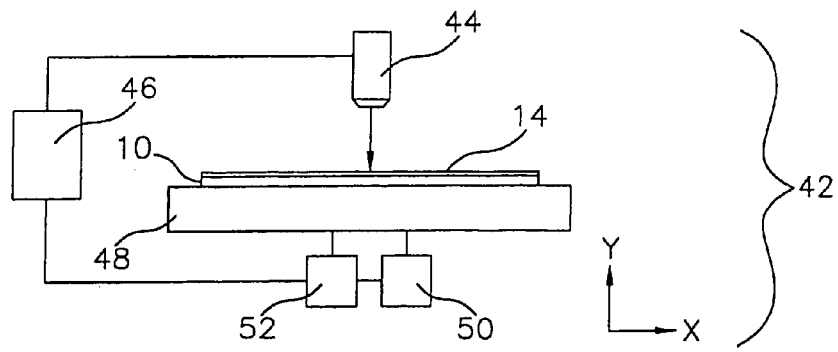
FIG. 4 is a schematic view of a laser system for performing the method of the invention.

Referring to FIG. 4, a laser system 42 for performing the method of the invention is illustrated. The laser system 42 includes a laser 44, and a computer controller 46 for the laser 44. In addition, the laser system 42 includes a base 48 adapted to support the substrate 10 for movement in X and Y directions. An X-axis driver 50, in signal communication with the computer controller 46, drives the base 48 in the X-direction. A Y-axis driver 52 in signal communication with the computer controller 46, drives the base 48 in the Y-direction.

A suitable laser system 42 is manufactured by General Scanning of Sommerville, Mass. and is designated as Model No. 670-W. A representative laser fluence for forming the grooves 15 (FIG. 2) in a conductive layer 14 comprising copper having a thickness of about 18 µm, is from 2 to 10 watts at a pulse duration of 20-25 ns and at a repetition rate of up to several thousand per second.

Referring to FIGS. 5, 5A and 5B, a BGA substrate 10BGA fabricated using a laser machining process is illustrated. In this embodiment the BGA substrate 10BGA comprises monocrystalline silicon. However, other materials such as plastic, glass filled resin, or ceramic can be employed. The BGA substrate 10BGA includes a conductive layer 14BGA having a pattern of conductors 16BGA formed thereon by laser machining grooves 15 (FIG. 5B) in the conductive layer 14BGA substantially as previously described.

As shown in FIG. 5B, each conductor 16BGA includes a pad 54. The pads 54 are adapted for flip chip mounting the semiconductor die 20 (FIG. 6) thereon. A size and pattern of the pads 54 on the conductors 16BGA matches a size and pattern of solder bumps 56 (FIGS. 6 and 6A) on the die 20. As shown in FIG. 6A, the solder bumps 56 are formed on the die bond pads 38 and die passivation layer 65 and can include an adhesion layer 62. Preferably the conductors 16BGA and pads 54 comprise a solder wettable metal such as copper. The pads 54 can also be covered with a solder wettable metal following the laser machining process, using a plating or deposition process.

As shown in FIG. 5A, the BGA substrate 10BGA also includes conductive vias 58 and external ball contacts 66 arranged in a ball grid array. Each conductor 16BGA is in electrical communication with a conductive via 58 and one or more ball contacts 66. The conductive vias 58 comprise openings 60 through the substrate 10BGA that include a conductive material, such as a metal, or a conductive polymer. On or more of the conductors 16BGA, and ball contacts 66 can be configured to provide co-planar impedance matching as previously described and shown in FIG. 2D.

One method for forming the conductive vias 58 is with a laser machining process. The previously identified Model No. 670-W laser machining apparatus manufactured by General Scanning of Sommerville, Mass. can be used to laser machine the openings 60 for the conductive vias 58. A representative diameter of the openings 60 for the conductive vias 58 can be from 10 µm to 2 mils or greater. A representative laser fluence for forming openings 60 through a substrate 10BGA formed of silicon and having a thickness of about 0.028-in (0.711 mm) is from 2 to 10 watts/per opening at a pulse duration of 20-25 ns and at a repetition rate of up to several thousand per second. With the substrate 10BGA comprising silicon the laser machined openings 60 can also be etched with a wet etchant such as KOH or TMAH. Etching enlarges and cleans the laser machined openings 60.

Rather than forming the openings 60 by laser machining, an etching process can be employed. In this case an etch mask (not shown) can be formed on the substrate 10BGA, and the substrate 10BGA etched through openings in the mask using a wet etchant. Suitable wet etchants with the substrate 10BGA comprising silicon include KOH and TMAH.

The conductive vias 58 can include a metal deposited within the openings 60 using a deposition process, such as CVD, electrolytic deposition or electroless deposition. Suitable metals include copper, aluminum, titanium, nickel, iridium, gold, tungsten, silver, platinum, palladium, tantalum, molybdenum or alloys of these metals. As another alternative, solder can be screen printed in the openings 60, as well as with capillary action, or with a vacuum system using a molten solder wave. In addition, the openings 60 can be completely filled with metal, or alternately just the inside surfaces or sidewalls of the openings 60 can be covered.

Rather than a metal, the conductive vias 58 can include a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the openings 60, as a viscous material, and then cured as required. A suitable deposition process, such as screen printing, or stenciling, can be used to deposit the conductive polymer into the openings.

With the substrate 10BGA comprising silicon, electrically insulating layers 114 can be formed on the surface of the substrate 10BGA, and within the openings 60, for electrically insulating the conductors 16BGA, and conductive vias 58, from a bulk of the substrate 10BGA. The insulating layers 114 are preferably formed prior to formation of the conductive layer 14BGA, and prior to deposition of the conductive material within the openings 60. The insulating layers 114 can comprise a deposited material such as $SiO_2$, or an insulating polymer, such as polyimide.

Referring to FIG. 5A, the conductive vias 58 also include pads 64 formed on a back side 68 of the substrate 10BGA. The pads 64 can have a circular, square, rectangular or other peripheral configuration. The pads 64 can be formed during formation of the conductive vias 58 using a suitable mask (not shown), such as a hard mask, or a stencil mask. For example, a metal can be blanket deposited on the back side 68 of the substrate 10BGA and into the openings 58 and then etched to form the pads 64. Alternately the pads 64 can comprise a different material than the conductive vias 58, and can be formed using a separate deposition process.

The contact balls 66 can be formed on the pads 64 in electrical communication with the conductive vias 58 and conductors 16BGA. The contact balls 66 provide connection points for making electrical connections from the outside to the conductive vias 58 and conductors 16BGA. If the contact balls 66 are not provided on the pads 64, the electrical connections from the outside can be made directly to the pads 64.

For reflow applications, the contact balls 66 can comprise a solder alloy such as 95% Pb/5% Sn, 60% Pb/40% Sn, 63% In/37% Sn, or 62% Pb/36% Sn/2% Ag. The contact balls 66 can also be a conductive polymer such as an isotropic or anisotropic adhesive. The contact balls 66 can also comprise a base metal, such as Cu or Ni, and an outer layer formed of a non-oxidizing metal such as Au, Ag or Pd. A representative diameter for the contact balls 66 can be from about 4 mils to 50 mils or more. A pitch of the contact balls 66 can be from about 6 mils to 50 mils or more.

One method for attaching the contact balls 66 to the pads 64 is by bonding pre-fabricated metal balls to the pads 64. For example, pre-fabricated metal balls are manufactured by Mitsui Comtek Corp. of Saratoga, Calif. under the trademark "SENJU SPARKLE BALLS". The metal balls can be attached to the pads 64 by soldering, laser reflow, brazing, welding, or applying a conductive adhesive. A solder ball bumper can also be used to bond the contact balls 66 to the pads 64. A suitable solder ball bumper is manufactured by Pac Tech Packaging Technologies of Falkensee, Germany. The contact balls 66 can also be formed on the pads 64 using a conventional wire bonder apparatus adapted to form a ball bond, and then to sever the attached wire. The contact balls 66 can also be formed by electrolytic or electroless deposition of a metal to form bumps.

Figure 7A:
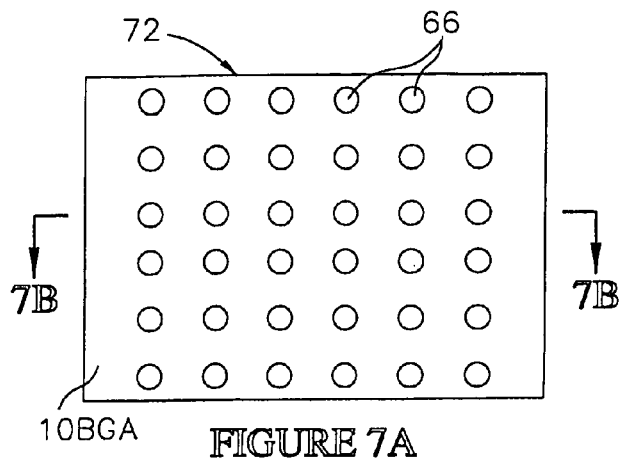
FIG. 7A is a bottom view of the package taken along line 7A-7A of FIG. 7.
Figure 7B:
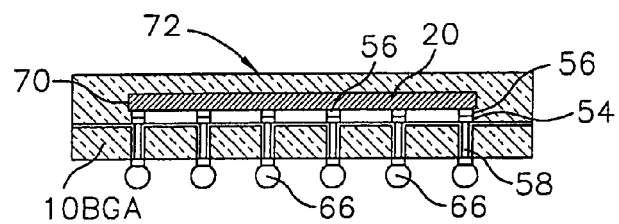
FIG. 7B is a cross sectional view of the package taken along section line 7B-7B of FIG. 7A.

Referring to FIGS. 7-7B, a semiconductor package 72 constructed with the BGA substrate 10BGA is illustrated. The package 72 includes the substrate 10BGA, a semiconductor die 20 flip chip mounted to the substrate 10BGA, and an encapsulant 70 covering the die 20, and face of the substrate 10BGA.

As shown in FIG. 7B, solder bumps 56 on the die 20 are bonded to the pads 54 on the conductors 16BGA of the substrate 10BGA. A reflow process can be used to bond the bumps 56 to the pads 54.

The encapsulant 70 can comprise an epoxy, silicone, room temperature vulcanizing (RTV), or polyimide material. Suitable encapsulants are commercially available from Dexter/Hysol under the trademark "HYSOL 4450", and from Thermoset under the trademark of "EP-729. The encapsulant 70 can be formed by dispensing a viscous encapsulant into a mold placed over the BGA substrate 10BGA, and then curing the viscous material.

Figure 8:
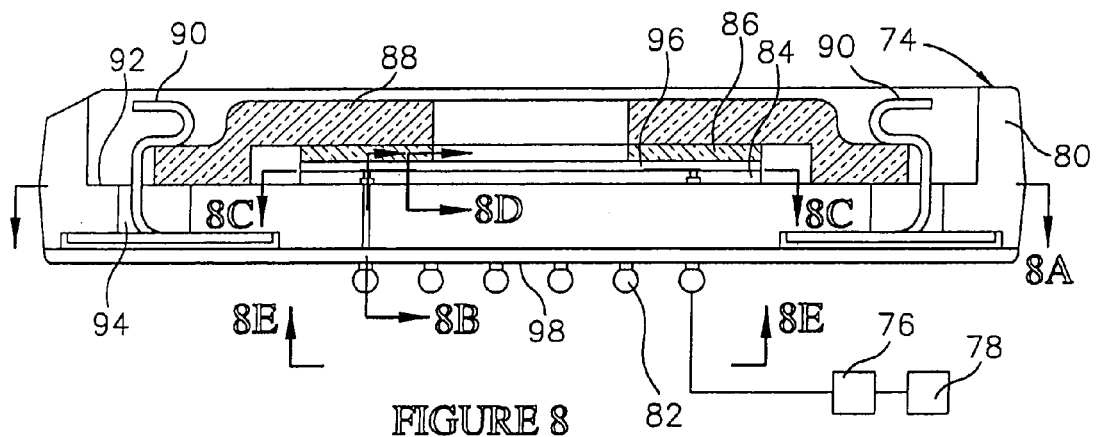
FIG. 8 is a cross sectional view of a test carrier having laser machined conductors formed using the method of the invention.
Figure 8E:
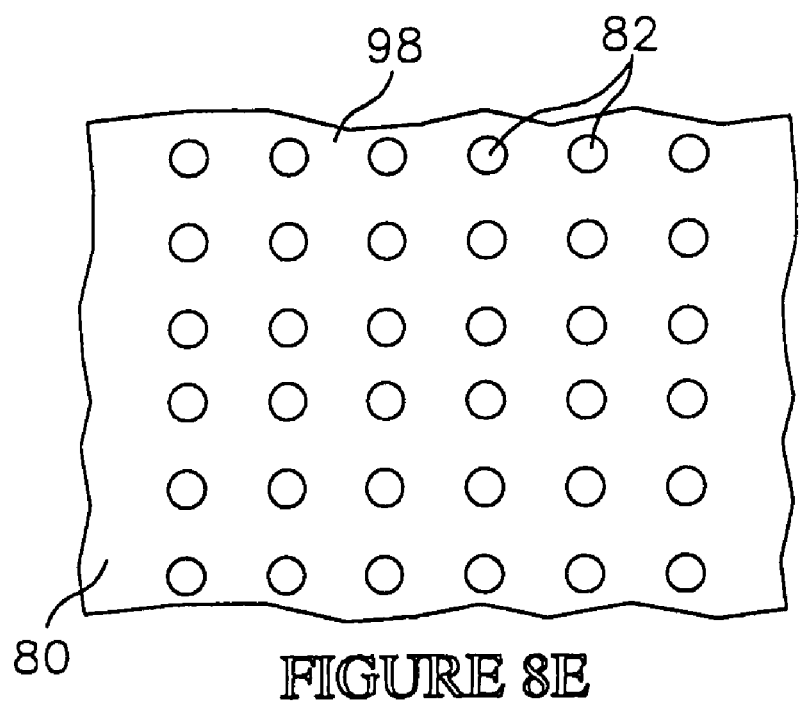
FIG. 8E is a bottom view taken along line 8E-8E of FIG. 8 illustrating external ball contacts on the test carrier.

Referring to FIGS. 8-8E, a test carrier 74 constructed using a laser machining process in accordance with the invention is illustrated. The test carrier 74 is adapted for testing a semiconductor component 96. As such, the carrier 74 includes an interconnect 84 adapted to establish temporary electrical communication with the component 96. Features of the interconnect 84 will be hereinafter described.

The component 96 can comprise an unpackaged die (e.g., die 20-FIG. 6) or a chip scale package (e.g., package 72-FIG. 7). For testing the component 96, the carrier 74 is configured for electrical connection to a burn-in board 76 (FIG. 8). The burn-in board 76 is in electrical communication with test circuitry 78 (FIG. 8) configured to apply test signals through the carrier 74 to the component 20A.

In addition to the interconnect 84, the carrier 74 includes a base 80 having a pattern of conductors 16TC formed thereon using the previously described laser machining process. In this embodiment a conductive layer 14TC can be deposited, or attached, to a surface 118 of the base 80 and grooves 15 laser machined in the conductive layer 14TC to define the conductors 16TC. The conductors 16TC include bonding pads 54TC configured for electrical communication with solder pads 112 (FIG. 8C) on the interconnect 84. The base 80 also includes conductive vias 58TC in electrical communication with the conductors 16TC and with external ball contacts 82. As shown in FIG. 8E, the ball contacts 82 are formed on a surface 98 of the base 80 in a ball grid array. One or more of the conductors 16TC and associated ball contacts 82, can be configured to provide impedance matching for selected conductors 16TC configured as signal traces, as previously described.

In addition, the ball contacts 82 are configured for electrical connection to corresponding electrical connectors, such as clips or socket contacts, on the burn-in board 76. The base 80 can be fabricated with conductive vias 58TC, and ball contacts 82 substantially as described in U.S. patent application Ser. No. 08/726,349, now U.S. Pat. No. 5,783,461, entitled "Temporary Semiconductor Package Having Hard Metal, Dense Array Ball Contacts And Method Of Fabrication", which is incorporated herein by reference.

The test carrier 74 also includes a force applying mechanism comprising a spring 86 and a cover 88. The carrier base 80 includes a recess 92 wherein the spring 86 and cover 88 are mounted. In addition, the carrier 74 includes clips 90 that mate with openings 94 on the base 80, and secure the cover 88 to the base 80.

In the assembled carrier 74, the cover 88 and the spring 86 bias the component 96 against the interconnect 84. Assembly of the carrier 74 with the component 96 therein can be accomplished as described in U.S. Pat. No. 5,634,267 entitled "Method And Apparatus For Manufacturing Known Good Semiconductor Die", which is incorporated herein by reference.

Figure 8F:
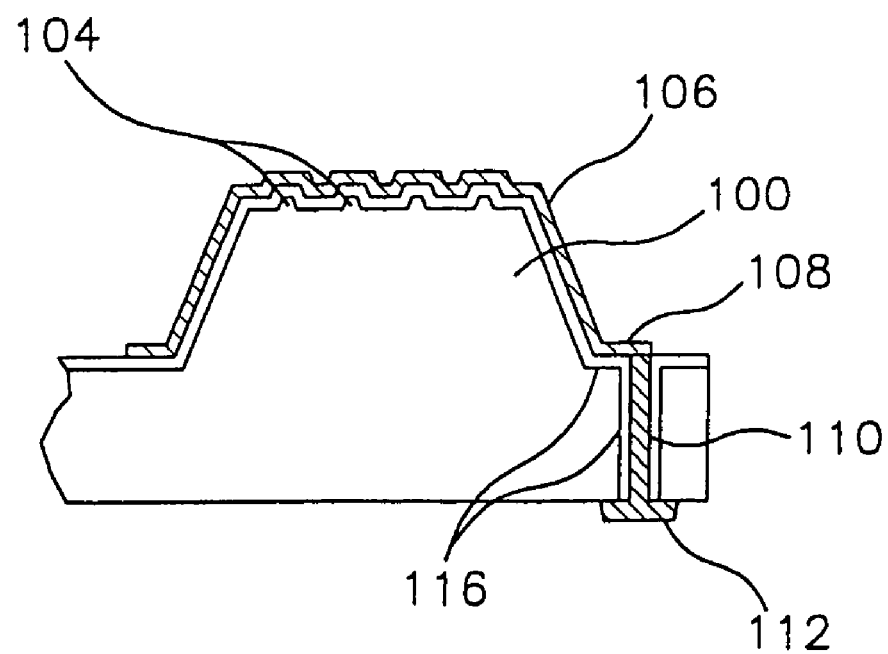
FIG. 8F is an enlarged cross sectional view taken along section line 8F-8F of FIG. 8C illustrating contacts on the interconnect.

Referring to FIGS. 8C, 8D and 8F, features of the interconnect 84 are shown. The interconnect 84 includes contacts 100 configured to electrically engage contacts 102 (FIG. 8D) on the component 96. The contacts 100 on the interconnect 84 include penetrating projections 104 covered with conductive layers 106. The conductive layers 106 are in electrical communication with conductors 108 (FIG. 8C) on the interconnect 84, and with conductive vias 110 (FIG. 8F) through the interconnect 84. In addition, an insulating layer 116 electrically isolates the conductive layers 106 and conductors 108 from the bulk of the interconnect 84. The insulating layer 116 also covers exposed surfaces of the interconnect 84 including the surfaces that may touch the conductors 16TC and conductive layer 14TC in the assembled test carrier 74.

As shown in FIG. 8F, the conductive vias 110 through the base 110 include solder pads 112. As shown in FIG. 8B, the solder pads 112 can be reflow bonded to the pads 54TC on the carrier base 80 to establish electrical communication between the external ball contacts 82 and interconnect contacts 100.

The interconnect 84 can be constructed substantially as disclosed in U.S. Pat. No. 5,686,317 entitled "Method For Forming An Interconnect Having A Penetration Limited Contact Structure For Establishing A Temporary Electrical Connection With A Semiconductor Die", which is incorporated herein by reference. U.S. patent application Ser. No. 08/993,965, now U.S. Pat. No. 6,107,109, entitled "Semiconductor Interconnect Having Laser Machined Contacts", which is incorporated herein by reference, also describes a method for fabricating the interconnect 84.

Thus the invention provides an improved method for fabricating semiconductor components such as printed circuit boards, multi chip modules, chip scale packages and test carriers for semiconductor components.

Although the invention has been described with reference to certain preferred embodiments, as will be apparent to those skilled in the art, certain changes and modifications can be made without departing from the scope of the invention as defined by the following claims.

We claim:

1. A test carrier for a semiconductor component comprising:
    a base having a conductive layer thereon;
    a plurality of conductors on the base defined by grooves through the conductive layer, the conductors separated from one another by portions of the conductive layer configured for no electrical transmission; and
    a plurality of first contacts on the base in electrical communication with the conductors and configured to electrically engage a plurality of second contacts on the component.

2. The test carrier of claim 1 further comprising a plurality of conductive vias in the base in electrical communication with the conductors and with a plurality of external contacts on the base configured for electrical communication with a test circuitry.

3. The test carrier of claim 1 further comprising a force applying mechanism attached to the base configured to bias the component against the first contacts.

4. The test carrier of claim 1 wherein the semiconductor component comprises a semiconductor die or a semiconductor package.

5. A test carrier for a semiconductor component comprising:
    a base;
    a conductive layer on the base;
    a plurality of conductors on the base comprising first portions of the conductive layer configured for electrical transmission;
    a plurality of grooves in the conductive layer defining and electrically isolating the conductors;
    a plurality of second portions of the conductive layer defined by the grooves and configured to separate the conductors without electrical transmission therethrough; and
    an interconnect mounted to the base comprising a plurality of first contacts in electrical communication with the conductors configured to electrically engage a plurality of second contacts on the component.

6. The test carrier of claim 5 further comprising a plurality of conductive vias in the base in electrical communication with the conductors and with a plurality of external contacts on the base.

7. The test carrier of claim 5 wherein the semiconductor component comprises a semiconductor die or a semiconductor package.

8. A test carrier for a semiconductor component having a plurality of component contacts comprising:
    a base;
    a conductive layer on the base;
    a plurality of conductors comprising first portions of the conductive layer configured for electrical transmission separated from one another by second portions of the conductive layer configured for no electrical transmission;
    a plurality of grooves through the conductive layer configured to define a shape and a spacing of each conductor, each groove having a micron sized width such that the conductors and the second portions substantially cover the base; and
    a plurality of contacts on the base in electrical communication with the conductors configured to electrically engage the component contacts.

9. The test carrier of claim 8 wherein the width for each groove is equal.

10. The test carrier of claim 8 wherein the width for each groove is about 5 μm.

11. The test carrier of claim 8 further comprising a force applying mechanism attached to the base configured to bias the component contacts against the contacts.

12. The test carrier of claim 8 wherein the contacts include projections configured to penetrate the component contacts.

13. The test carrier of claim 8 further comprising a plurality of conductive vias in the base in electrical communication with the conductors and with external contacts on the base.

14. The test carrier of claim 8 wherein with a thickness of the conductive layer, and a width of the grooves are selected to provide an impedance for the conductors.

15. The test carrier of claim 8 further comprising a burn in board in electrical communication with the contacts on the base.

16. The test carrier of claim 8 further comprising a test circuitry configured to apply test signals through the contacts on the base to the component.

17. A test carrier for a semiconductor component having a plurality of component contacts comprising:
    a base having a plurality of external contacts;
    a conductive layer substantially covering the base;
    a plurality of conductors in electrical communication with the external contacts comprising portions of the conductive layer configured for electrical transmission;
    a plurality of grooves in the conductive layer electrically isolating the conductors, each conductor having opposing edges defined by a pair of grooves and remaining portions of the conductive layer on either side separated from the opposing edges by the pair of grooves; and
    an interconnect on the base comprising a plurality of contacts in electrical communication with the conductors configured to electrically engage the component contacts.

18. The test carrier of claim 17 wherein a thickness of the conductive layer and a size and a spacing of the conductors are selected to provide a desired impedance value for the conductors.

19. The test carrier of claim 17 wherein a width for each groove is equal.

20. The test carrier of claim 17 wherein a thickness of the conductive layer is selected to facilitate laser machining of the grooves.

21. The test carrier of claim 17 further comprising a plurality of conductive vias through the base in electrical communication with the conductors and with the external contacts on the base.

22. The test carrier of claim 21 wherein the conductive vias include first pads bonded to second pads on the interconnect in electrical communication with the contacts.

23. The test carrier of claim 17 wherein the base is configured for mounting to a burn in board in electrical communication with a test circuitry.

24. The test carrier of claim 17 wherein the contacts include projections configured to penetrate the component contacts.

25. The test carrier of claim 17 wherein the semiconductor component comprises a semiconductor die or a semiconductor package.

* * * * *

UNITED STATES PATENT AND TRADEMARK OFFICE
CERTIFICATE OF CORRECTION

PATENT NO. : 7,256,490 B2
APPLICATION NO. : 11/591744
DATED : August 14, 2007
INVENTOR(S) : Farnworth et al.

It is certified that error appears in the above-identified patent and that said Letters Patent is hereby corrected as shown below:

In column 9, line 43 (Approx.), in Claim 5, delete "abase;" and insert -- a base; --, therefor.

Signed and Sealed this

Twentieth Day of November, 2007

JON W. DUDAS
*Director of the United States Patent and Trademark Office*